United States Patent [19]
Ochi

[11] Patent Number: 5,654,896
[45] Date of Patent: Aug. 5, 1997

[54] PERFORMANCE PREDICTION METHOD FOR SEMICONDUCTOR POWER MODULES AND ICS

[76] Inventor: Sam Seiichiro Ochi, 11208 Mount Crest Dr., Cupertino, Calif. 95014

[21] Appl. No.: 332,482

[22] Filed: Oct. 31, 1994

[51] Int. Cl.⁶ .................. H01L 29/78; G06F 11/00
[52] U.S. Cl. .................. 364/488; 364/551.01; 340/511; 371/25.1; 324/765
[58] Field of Search .................. 364/550, 551.01, 364/551.02, 554, 488, 578; 324/158.1, 765, 500; 340/505, 507, 511, 635, 653; 371/25.1, 26; 395/575

[56] References Cited

U.S. PATENT DOCUMENTS

| | | | |
|---|---|---|---|
| 3,673,397 | 6/1972 | Schaefer | 235/153 |
| 4,514,720 | 4/1985 | Oberstein et al. | 340/511 |
| 4,727,359 | 2/1988 | Yuchi et al. | 340/511 |
| 4,749,987 | 6/1988 | Ishii | 340/511 |
| 4,773,028 | 9/1988 | Tallman | 364/550 |
| 4,803,469 | 2/1989 | Matushita | 340/511 |
| 4,825,195 | 4/1989 | Berruyer | 340/511 |
| 4,831,564 | 5/1989 | Suga | 364/551.01 |
| 4,931,844 | 6/1990 | Zommer | 357/23.4 |
| 5,019,998 | 5/1991 | Cowan et al. | 364/578 |
| 5,050,114 | 9/1991 | Lee | 364/578 |
| 5,063,307 | 11/1991 | Zommer | 307/310 |
| 5,088,058 | 2/1992 | Salsburg | 364/578 |
| 5,117,377 | 5/1992 | Finman | 364/578 |
| 5,155,468 | 10/1992 | Stanley et al. | 340/511 |
| 5,307,018 | 4/1994 | Gadgil | 324/158.1 |
| 5,325,054 | 6/1994 | Houston | 324/158.1 |
| 5,331,579 | 7/1994 | Maguire et al. | 364/578 |
| 5,440,241 | 8/1995 | King et al. | 324/765 |
| 5,448,165 | 9/1995 | Hodge | 324/158.1 |
| 5,461,328 | 10/1995 | Devereaux et al. | 324/765 |
| 5,481,551 | 1/1996 | Nakano et al. | 371/27 |
| 5,485,097 | 1/1996 | Wang | 324/765 |
| 5,495,179 | 2/1996 | Wood et al. | 324/765 |
| 5,500,588 | 3/1996 | Worley | 324/158.1 |
| 5,509,019 | 4/1996 | Yamamura | 324/765 |

*Primary Examiner*—Kevin J. Teska
*Assistant Examiner*—Tyrone V. Walker

[57] ABSTRACT

Apparatus (30) and method (70) for predicting the future performance of a semiconductor power module, power device, or high power integrated circuit for the purpose of planning its repair or replacement before it actually fails. The apparatus provides a central processor (33), output device (37), user interface (39), system memory (35), and data base (41). The method is provided by an application specific integrated circuit (45) or custom software program (45). The method provides a measurement and testing procedure for device parameters such as thermal resistance $R_{thJC}$, power supply voltage $V_{DD}$, and power supply current $I_{DD}$. These device parameters typically characterize various chip components including the die attached interface, chip structure, and bonding wires. As these components degrade, the method via monitoring device parameters turns-off the device and its peripheral circuits and apparatus in an orderly manner.

20 Claims, 3 Drawing Sheets

PERFORMANCE PREDICTION METHOD FOR SEMICONDUCTOR POWER MODULES AND ICS

BACKGROUND OF THE INVENTION

The present invention relates to an apparatus and method for predicting future performance of semiconductor power modules, power devices, or high power integrated circuits for the purpose of planning the repair or replacement before actual breakdown. These power modules, power devices, or high power integrated circuits include power metal oxide silicon field effect transistors (MOSFETs), power insulated gate bipolar transistors (IGBTs), insulated gate thyristors (IGTHs), thyristors, microprocessors (MICROS), application specific integrated circuits (ASICS), or any other semiconductor devices which dissipate large amounts of energy, are hereinafter referred to as chips.

The increasing use of semiconductor chips demands the need for chips having reliable and predictable performance characteristics. Semiconductor chips play an important role in our modern day lives by providing component parts for computerized networks for business and banking, computerized medical equipment, integrated manufacturing plants, automobiles, communication systems, etc. For these applications, these chips are the basic building blocks which provide the means for performing various functions. The computerized network in a bank, for example, relies upon system hardware comprising semiconductor chips. If a critical semiconductor chip within this network fails, the entire network shuts down and ceases all electronic transactions. As such, it is important that semiconductor chips perform reliably and predictably when they are integrated into an apparatus having such an impact on our everyday lives.

However, today's chips are inherently limited by their physical size, lead frame design, die attach process, and bonding wires. As technology progresses, the internal device dimensions of a typical chip are often smaller, but the physical or actual size of the typical chip is becoming larger. The larger chip with smaller internal dimensions creates an even more powerful integrated circuit device. These larger chips include, for example, power devices, microprocessors, gate arrays, and the like. The larger chips may have lengths at about ½ inch and greater while their predecessors had lengths typically about 200 mils. As for their operating features, these chips may perform at high currents, high voltages, or high operating speeds. At these operating conditions, larger chips generate more heat than their smaller predecessors, thereby having higher operating temperatures. These characteristics exist because heat becomes more difficult to dissipate through the larger chip than the smaller predecessor chips. As the operating temperature increases, the chip's efficiency, predictability, and life expectancy decrease.

As for the lead frame, the chips are typically mounted or die attached onto a copper lead frame instead of the Alloy 42 industry standard. The industry shifted towards this copper lead frame because copper provides a higher thermal conductivity, lower cost, and smaller geometry for packaging via surface mount technology (i.e., Plastic Leadless Chip Carrier also called PLCC). However, in contrast to Alloy 42, the copper lead frame possesses a substantially larger coefficient of thermal expansion. At high temperatures, the die island underlying the chip will expand at a much faster and greater rate than the overlying silicon die, and thereby cause the die to stress, crack, and ultimately fail.

As the industry shifted away from the conventional gold/silicon eutectic die attach on the Alloy 42 lead frame and to the solder/silicon eutectic or silver paste epoxied die attach on a copper lead frame, these problems described herein occurred more frequently. For example, a power device's operating temperature increases from ambient to about 150° C. after being turned-on. As the temperature increases, the die island comprising copper expands at a faster and greater rate than the overlying silicon die. This process will gradually decay a somewhat flexible interface comprising a eutectic solder/silicon (or silver paste epoxy) between the die and its island. As the interface decays over time, the thermal resistance between the die and its island gradually increases. This increases the voltage drop as well as the heat being dissipated, thereby decreasing the current flow. After repeated cold/hot heat cycling, the average current flowing through the device decreases. As this occurs, the device begins to run outside its operating limits, and eventually, the device fails. In contrast, the interface comprising a gold/silicon eutectic die attach provides a rigid bond between the die and its island. This rigid bond becomes problematic when the die island expands at a faster and greater rate than the overlying die during extreme increases in temperature. During these conditions, the die typically breaks and suddenly fails. Presently, since most chips rely on either the solder/silicon eutectic or silver paste die attach, the aforementioned problems are more prevalent.

Repeated temperature cycling also expands and compresses the bonding wires during device turn-on and turn-off. This process gradually causes the wires to become brittle, and eventually, the wires may even break. With today's power devices operating at their high temperatures or larger high pin count devices with hundreds of individually bonded wires, this problem occurs frequently.

Traditional approaches for detecting these problems to continuously characterize the future performance of a chip have been few to non-existent. A method for predicting the future performance of a chip include discrete measurements of operating currents and temperatures of the chip by an operator, technician, or engineer. After taking the measurement and comparing it to the manufacturer's specification, if the device is not outside of its specified limits, this person typically decides by "gut" instincts whether to replace the chip. Most often, the chip is only replaced when it fails. This procedure, also called break maintenance, is expensive and creates a variety of problems if the particular chip is integral to a critical apparatus.

Alternatively, if routine preventive maintenance is performed, an operator, technician, or engineer typically replaces the chip before any signs of failure exist. In particular, technicians often replace every high power switching device within a particular circuit in an attempt to prevent a chronic failure in the future. Since good chips are being replaced as well as bad chips, this method becomes expensive, inefficient, and time consuming.

There have been attempts to place a mixture of complex sensors, transducers, and measuring devices with a critical chip to measure its performance. Typically, this approach switches the device off when a predetermined state is reached for the variable being tracked. This predetermined state is often based upon the device specification as suggested by the manufacturer. This approach may also rely upon the temperature sensing technique for a power MOS device as disclosed in U.S. Pat. No. 5,063,307, issued Nov. 5, 1991, or the use of the current mirror technique for providing voltage, current, power, resistance, and temperature sensing capability as disclosed in U.S. Pat. No. 4,931,844, issued Jun. 5, 1990, which are both hereby incorporated by reference.

However, these attempts only monitor the snap-shot value of the current state of a single device parameter, and are generally ineffective for continuously tracking the high number of variables required for reliably predicting the chip's behavior. For a MOSFET, these variables include a thermal resistance $R_{th}$, on-resistance $R_{DSON}$, power supply current $I_{DD}$ and voltage $V_{DD}$, and the like. Alternatively, an IGBT requires the tracking of $R_{th}$, $I_{DD}$, $V_{DD}$ as well as collector-to-emitter saturation voltage $V_{CESAT}$, and the like. Since this approach is limited to measuring the snap-shot value of a single variable, it becomes too complicated to be realizable or practical with the high number of measurements needed for reliably predicting the future performance of the chip.

SUMMARY OF THE INVENTION

The present invention provides a superior method and apparatus for continuously tracking the performance of a chip through power and temperature measurements. This method and apparatus predict the future behavior of the device before its actual failure by monitoring a plurality of variables. The benefits of this present invention are achieved in the context of known technology.

The present invention provides a method for predicting the future performance of a semiconductor chip before its actual failure. In a specific embodiment, the method provides initializing a system data base with starting values for device parameters representing different device characteristics. After initializing, the method provides measuring a plurality of snap-shot values for each of the device parameters being monitored while the device is in an operating state. These values are measured at predetermined times and intervals. After the snap-shot values are time dated, stamped, and stored in system memory, the method provides a step of calculating operating limits for each of the device parameters based on the starting values and snap-shot values. These operating limits may be calculated by statistical process control techniques. The snap-shot values are then tested against the operating limits to produce a plurality of results. These results are then used for selecting an output. If the output is not an alarm state, the method continues measuring snap-shot values, recalculating operating limits, and testing the snap-shot values against the operating limits.

Alternatively, if the output is an alarm state, the method shuts down the device and its peripheral circuits, and shuts down the system and its peripheral operations in an orderly manner. By powering down the system in this orderly manner, damage to the system and its peripheral operations are reduced. This alarm state alerts an operator, technician, or engineer and shuts down the system before the actual failure of the device. The operator, technician or engineer then repairs or replaces the device at this time or some predetermined time thereafter. To facilitate the repair, this person reviews the history of the measured values which are retrieved from the system memory.

As for the parameters being measured, this embodiment includes at least a thermal resistance $R_{th}$. For MICROs and ASICs, $R_{th}$ may be measured indirectly by observing $I_{DD}$ or $V_{th}$ of internal test MOS structures. When the application is for a MOSFET, the embodiment includes measuring an on-resistance $R_{DSON}$, power supply voltage $V_{DD}$ and current $I_{DD}$, and the like. As for an IGBT, an alternative embodiment includes measuring a collector to emitter saturation voltage $V_{CESAT}$ as well as $V_{DD}$ and $I_{DD}$, and the like.

The method also provides feedback to the device manufacturer. When the suspect chip is replaced, it is analyzed for failure modes. After determining the cause of the failure mode, the corresponding chip making process is adjusted as necessary to provide a more reliable and predictable chip. To predict the future behavior of the improved chip, the operating limits are adjusted accordingly by this method. This latter embodiment provides for the continuous improvement of the prediction method as well as the device.

Furthermore, the present invention provides for an apparatus or a system for performing the method described herein. This system provides a central processor, output device, user interface, and system memory. To carry out this method, the system provides either an application specific integrated circuit in chip form or custom software within the system memory. To monitor the chip, this system is interconnected to the device being monitored. In an alternative embodiment, the system monitors a plurality of semiconductor devices. Each semiconductor device being monitored may be a different type of semiconductor device where a plurality of different device parameters are being monitored from each device.

Still further, the present invention provides a method of identifying a reject semiconductor device. The present method includes steps of initializing a system data base by providing an initial value for a device parameter for a semiconductor device and exercising the semiconductor device. The present method also includes successively measuring a snap-shot value of the device parameter during the exercising step and calculating a plurality of average values from the initial device parameter and the snap-shot value. A step of identifying differences between each of the average values is also provided. The present method includes further includes rejecting the semiconductor device based upon said differences.

A further understanding of the nature and advantages of the present invention may be realized by reference to the latter portions of this specification and attached drawings.

DESCRIPTION OF THE SPECIFIC EMBODIMENT

Figure 1:
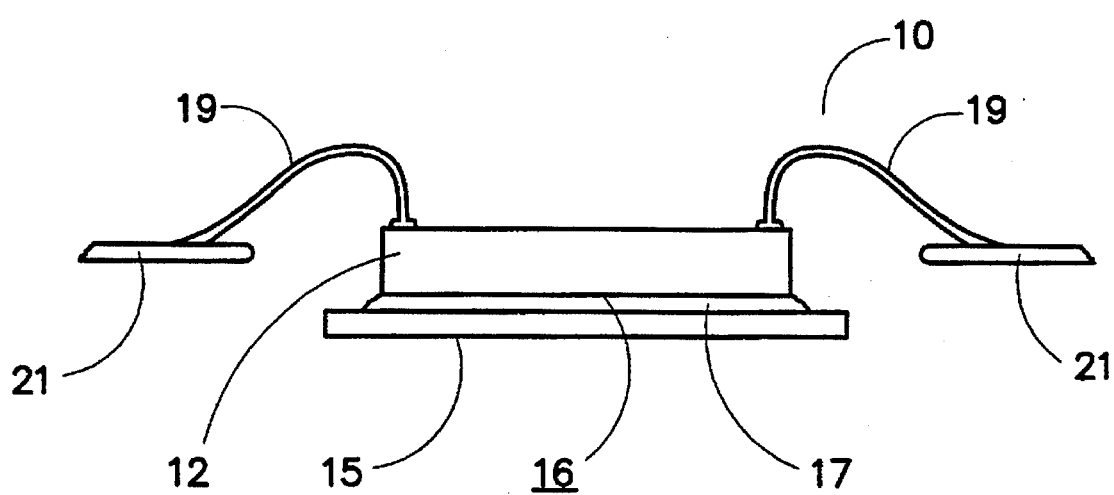
FIG. 1 is a cross-sectional view of a typical chip.

FIG. 1 is a cross-sectional view of a partially packaged chip 10. This chip is partially packaged for illustration purposes. The chip includes a die 12 which is mounted (or die attached) onto its die island 15. This chip provides a backside surface 16 which is typically, but not limited to, bare silicon. The die island which was originally a portion of the lead frame is composed of either copper, copper alloy, Alloy 42, or the like. The interface 17 between the die and the island provides a means for attaching the two structures together as well as their electrical connection. Depending upon the required application, the interface may comprise either silicon/solder/copper, copper/aluminumnitride/copper, copper/solder/copper, silicon/silver/copper, or the like. This interface provides more flexibility between the die and its island than the rigid gold/silicon eutectic interface. The chip also provides bonding wires 19 interconnecting the lead frame fingers 21 to the bonding pads of the die. The bonding wires are typically gold or aluminum. The fingers, since they were originally a portion of the lead frame, have the same composition. These fingers are also plated with either silver or gold, depending upon the application. In addition, each finger has a corresponding pin all within a single structure. This pin is exposed outside the package to provide an electrical contact to a circuit. As shown, the various elements of this chip including the die, die island, fingers, bonding wires, and interface are composed of different materials.

These different materials possess unique thermal properties which contribute to a variety of problems after repeated turn-on and turn-off. In particular, the operating temperature of a power device, for example, increases from ambient to about 150° C. upon device turn-on. Alternatively, when the device is turned-off, its temperature decreases from about 150° C. to ambient. As the temperature of the device increases and decreases, the various components expand and contract at different rates and to different lengths. Typically, the underlying copper island expands and contracts at a greater rate and to a greater length than the overlying die. This expansion and contraction creates stress on the interface. After repeated turn-on and turn-off, the somewhat flexible interface cracks and/or separates. As the interface gradually decays, a thermal resistance $R_{thJC}$ between the die and its island increases. This causes the chip to operate at a higher temperature, higher voltage drop, and lower current flow. Eventually, the chip operates outside of its operating limits and/or ultimately fails.

In addition, repeated temperature cycling of the chip may cause a structural crack therein. As discussed, the die island comprising copper, for example, expands at a faster rate and to a greater length than the overlying die. This creates stresses and strains within the die. If a critical defect exists within the silicon crystal, the die island via thermal expansion pulls the chip apart during device turn-on.

Repeated temperature cycling also degrades the bonding wires. In particular, temperature cycling which occurs during device turn-on and turn-off expands and compresses the wires, respectively. As this occurs repeatedly, the wires become brittle and even break, thereby causing the device to fail.

The failure of a semiconductor chip also leads to the following consequential problems described herein. In particular, when the chronic failure occurs, the failing device typically shuts the entire system off, or stated in the alternative, causes the system to crash. If this occurs while the system is operating, further damage to its peripheral circuits, memory storage devices, or the like may also occur. This damage in terms of maintenance and operating costs is usually six-times greater than planned maintenance.

In addition, the failure of a critical semiconductor chip can, for example, also create safety hazards if the device was providing switching functions for a health sensitive operation. A health sensitive operation may include a high temperature chemical reactor using corrosive chemicals and heating elements where the operation is frequented by operators within a processing plant. The failure of a critical chip within this type of operation may cause the reactor to overheat, thereby causing corrosive chemicals to boil out near operators. In this type of operation, failure of a critical semiconductor chip will create serious safety related problems.

With the present invention, the various problems described are predicted before actual failure by carefully monitoring a plurality of device parameters. For a MOSFET, these device parameters include, for example, a thermal resistance $R_{th}$, on-resistance $R_{DSON}$, power supply current $I_{DD}$ and voltage $V_{DD}$, and the like. Alternatively, for an IGBT, these device parameters include the thermal resistance $R_{th}$, power supply current $I_{DD}$, and voltage $V_{DD}$, as well as a saturation voltage between the collector and emitter $V_{CESAT}$ and the like. Unlike those chips having smaller geometries, smaller packages, and gold/silicon eutectic die attach, the future performance of the chip in FIG. 1 can be predicted by continuously monitoring a plurality of these device parameters.

Figure 2:
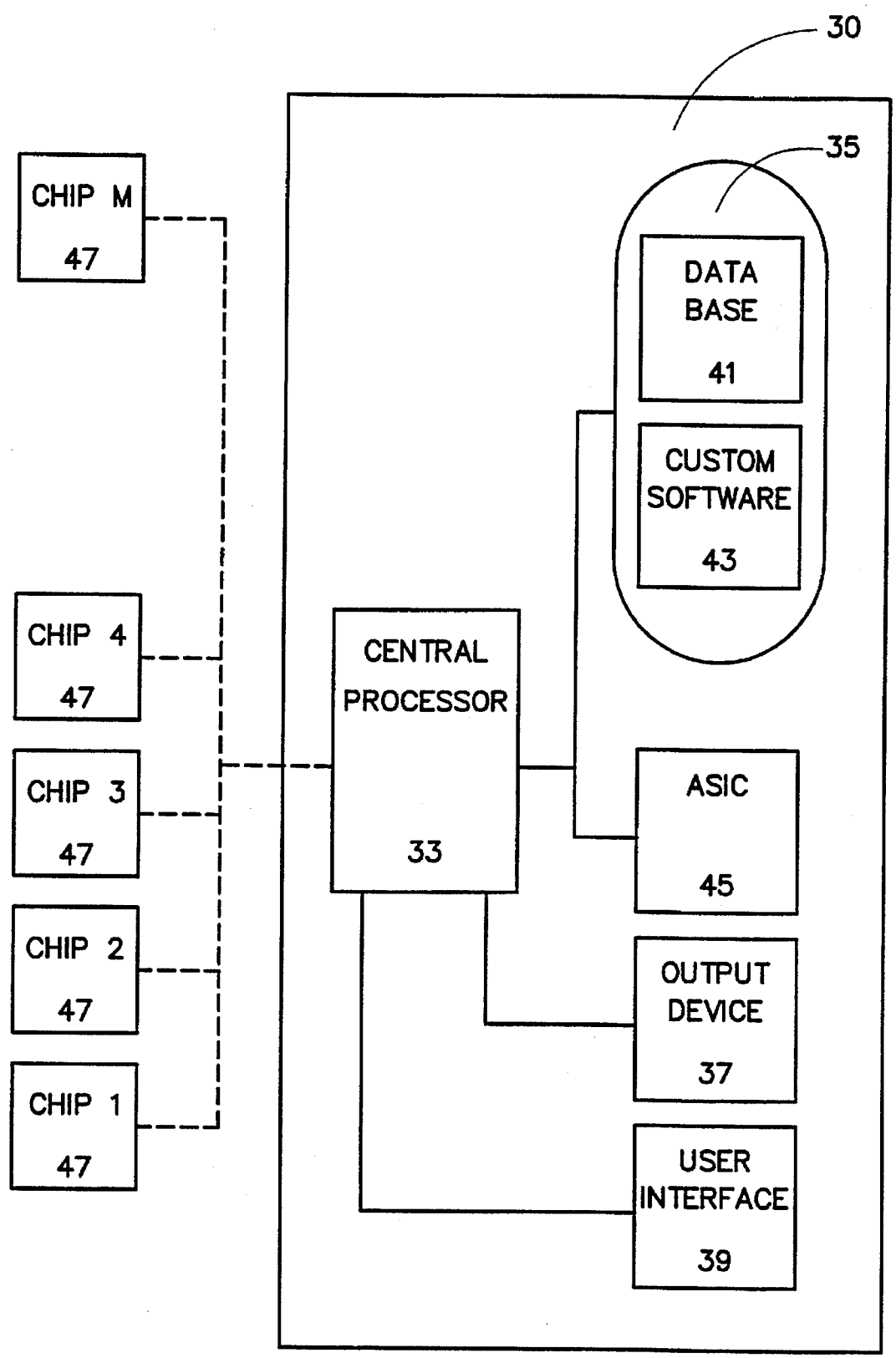
FIG. 2 is an overview of the performance prediction apparatus.

A performance prediction apparatus or system 30 is shown in the box of FIG. 2. The solid lines between the various components represent the interconnections between the system elements, while the dashed lines represent the interconnections for obtaining the parameters ($X_1, X_2 \ldots X_n$) from each chip 47 (chip 1 to chip 17) being monitored. The system provides a central processor 33, a system memory 35, an output device 37, a user interface 39, and a data base library 41 within system memory. The apparatus also provides either a custom system software package 43 in the system memory or an application-specific hardware in chip form 45 to define the method described herein. The chips being monitored are typically integrated within a larger system.

Figure 3:
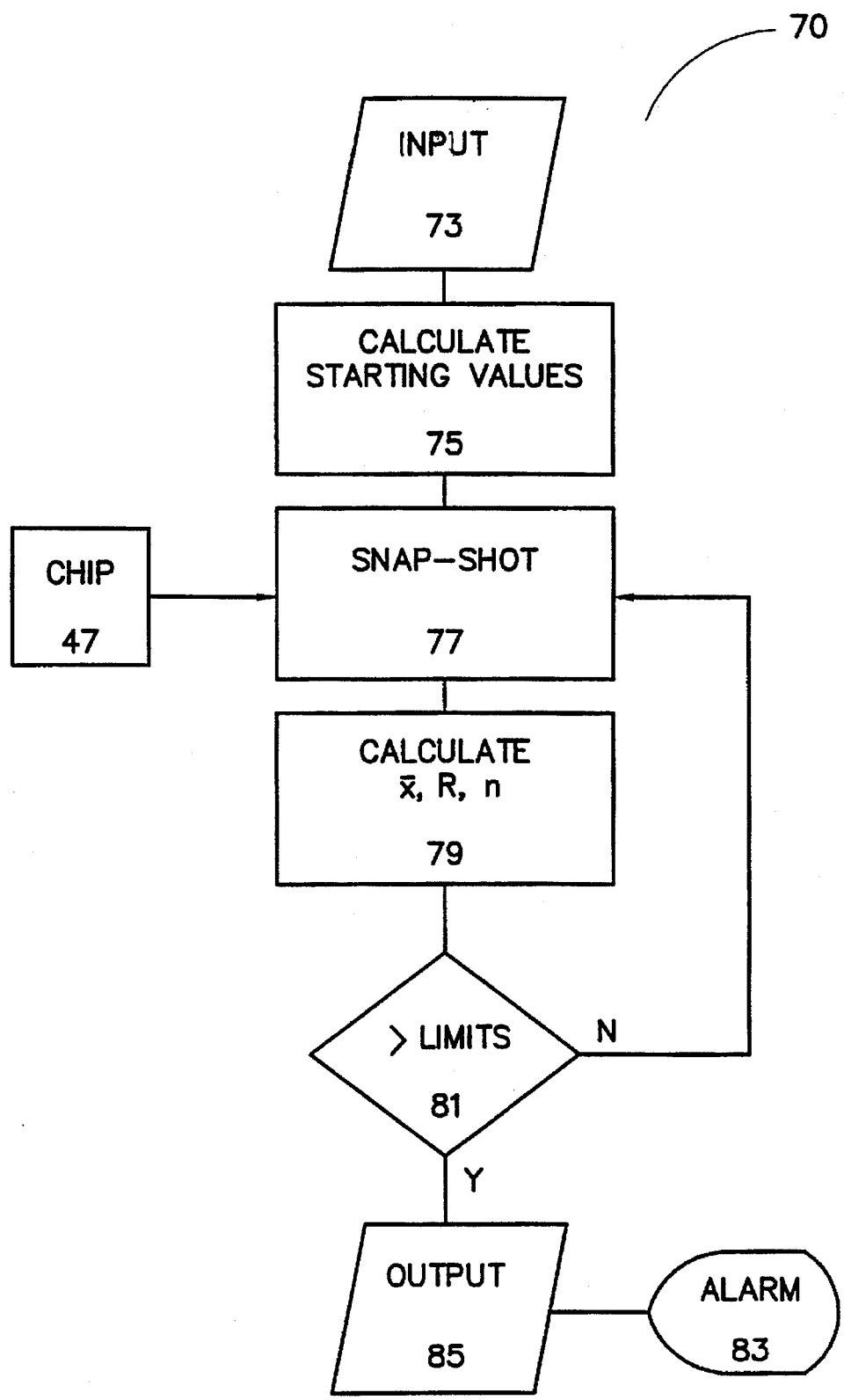
FIG. 3 is an overview a flow chart representing the method for the apparatus shown in FIG. 1.

A method for the performance prediction system of FIG. 1 is shown by a flow chart 70 of FIG. 3. The user must first initiate the input of initial device parameters into the system through the input device to create a data base of initial device parameters. This occurs by providing input 73 of initial device parameters or variables comprising actual measured values and manufacturer's specified values into system memory through the user interface. The central processor in combination with the application specific hardware or software coordinates this function so that the initial device parameters are properly stored in the data base library within the system memory. Actual values or measurements of device parameters are also read into the system from each chip. This information is also stored into the data base library within the system memory. For a MOSFET, these device parameters may include, for example, $R_{thJC}$, $R_{DSON}$, $I_{DD}$, $V_{DD}$, and the like. Alternatively, for an IGBT, the device parameters may include, for example, $R_{th}$, $V_{CESAT}$, $I_{DD}$, $V_{DD}$, and the like. Additional parameters such as ambient equipment temperature, ambient humidity, and the like may also be provided as necessary. The initial accuracy of the actual values or measurements depend on the accuracy of the built-in current and temperature sensors or the like as well their peripheral circuits. For current and temperature measurements, this method provides an accuracy of at least 1% and ±3° C., respectively, based upon available technology. This accuracy level allows the present system to predict the future performance of each chip reliably.

With this data base, starting values of device parameters are then calculated and stored into the database library within system memory. These starting values of device parameters allow the system to initialize to a known state and are, for example, the actual measured values, manufacturer's specified values, or a combination thereof. In particular, the starting values may be calculated by averaging the actual measured value and the manufacturer's specified value for a particular device parameter. These starting values are only estimates which allow the system to initialize (or be set to a known state) and may or may not correspond to manufacturer's specifications.

After initializing, the central processor retrieves snap-shot 77 measurement values of the parameters ($X_1, X_2 \ldots X_n$) from each chip 47 at predetermined times. These times are at, for example, turn-on, just before turn-off, and periodic time frequencies between turn-on and turn-off. A periodic time frequency between turn-on and turn-off may be about 1 hour and greater. Each measurement includes a corresponding time and date stamp for easy identification. The central processor stores these measurements into the database library within system memory. In addition, the central processor also calculates and stores in the database library an average-value and a range R for a predetermined number n of measurements 79 for each parameter. The predetermined number n depends upon the parameter being measured for a particular device as well as the accuracy level required based upon statistical process control techniques.

The snap-shot value, average value, and/or range for a particular device parameter are tested against their operating limits 81 to produce a plurality of results. Based upon the results, the central processor selects a desired output. If the output is an alarm state 83, this signal is sent to the output device comprising at least an alarm 85. The central processor also sends an alarm state after a predetermined number of hours, measurements, or the like. The central processor then switches the apparatus into a stand-by mode and/or turns-off the chip as well as its peripheral operations and systems. This sequence of steps ensures minimal damage to the chip, peripheral circuits, and systems. The output device then alerts an operator, technician, engineer, or the like. This person replaces or repairs the suspect device before its actual failure. To assist in this procedure, such person retrieves the historical snap-shot measurements as well as average values and ranges from system memory and reviews the data. Alternatively, if the results do not trigger an alarm state, the system continues to measure snap-shot values, calculate operating limits, test the snap-shot values against their operating limits, and select an output dependent upon the results.

The operating limits are calculated based on statistical process control techniques. Typical values for $R_{thJC}$ and $V_{CESAT}$ for an IGBT are at about 20% above their starting values. These limits are refined through statistical process control procedures. Statistical process control procedures rely upon historical data in combination with statistics to provide the operating limit for each variable. The operating limits are recalculated by the central processor after collecting the predetermined number of measurements m. By continuously refining these limits, the method ensures that the future performance of each chip is reliably predicted.

For example, a starting value for a measured parameter such as $R_{thJC}$ or the like is obtained, and snap-shot values for the same measured parameter are obtained at a desired interval or frequency. The combined measurements provide data which can be evaluated by way of statistical process control techniques. Statistical process control techniques allow the system to focus on relative changes between each additional measurement obtained, rather than the absolute value of each measured parameter. Based upon the trend of the data, the system may either correct or adjust an operating limit or switch into the stand-by mode. Accordingly, it is often not necessary to obtain extremely accurate measurements for each data point as long as the relative accuracy of each data can be maintained.

The operating limits are further refined by performing autopsies on the replaced or failed devices. These autopsies may reveal the actual cause of the failures. After determining the cause, the manufacturer adjusts the corresponding process parameters to improve device characteristics for greater predictability and reliability. Once greater predictability and reliability are achieved, the system redefines the operating limits to conform to the improved characteristics.

While the above is a full description of the specific embodiments, various modifications, alternative constructions, and equivalents may be used. For example, while the description above is in terms of a single system, it would be possible to implement the present invention with multiple net worked systems, or the like. The apparatus shown was built by employing a central processor based system with application specific software or hardware. A skilled artisan may, alteratively, employ a combination of hardware and software or the like. Furthermore, the different embodiments shown above are, for example, in context to a power semiconductor device. Alternatively, the embodiments may be in context to microprocessors, application specific ICs, or the like.

Therefore, the above description and illustrations should not be taken as limiting the scope of the present invention which is defined by the appended claims.

What is claimed is:

1. A method of predicting the future performance of a semiconductor integrated circuit device comprising the steps of:

(a) providing a semiconductor device, said semiconductor device being mounted by an interface material on an island;

(b) providing power to said semiconductor device, said power causing thermal expansion of said die island, said interface material, and said semiconductor device;

(c) initializing a system data base by providing a plurality of starting values from said semiconductor device into a system database, said starting values representing a plurality of device parameters;

(d) measuring a plurality of snap-shot values for each of said device parameters while said device is in said powered state;

(e) calculating a plurality of operating limits for each of said device parameters, said operating limits based upon said starting values and snap-shot values;

(f) testing said snap-shot values against said operating limits to produce a plurality of results;

(g) selecting an output dependent upon said results;

(h) if said output is not an alarm state, repeating steps (d) to (g) until said output is said alarm state; and (i) predicting a performance based on said results.

2. The method of claim 1 wherein said device parameters includes a thermal resistance $R_{thJC}$.

3. The method of claim 2 wherein said device parameters further includes an on-resistance of a MOSFET $R_{DSON}$, power supply voltage $V_{DD}$, and a power supply current $I_{DD}$.

4. The method of claim 2 wherein said device parameters further includes a collector to emitter saturation voltage for an IGBT $V_{CESAT}$, power supply voltage $V_{DD}$, and a power supply current $I_{DD}$.

5. The method of claim 1 wherein said measuring step occurs at a turn-on, at just before a turn-off, and at periodic time frequency between said turn-on and said turn-off.

6. The method of claim 5 wherein said periodic time frequency is about one hour and greater.

7. The method of claim 1 further comprising the step of turning said device off, turning a system off, and repairing or replacing said device if said output is in an alarm state.

8. The method of claim 1 wherein each of said starting values are calculated from an initial snap-shot value and a manufacturer's specified value.

9. The method of predicting the future performance of a plurality of semiconductor integrated circuit devices integral within a system comprising the steps of:

(a) providing a plurality of semiconductor device, each of said semiconductor devices being attached to an island by an interface material;

(b) providing power to each of said semiconductor devices, said power expanding causing thermal expansion of said island, said interface material, and each of said semiconductor devices;

(c) initializing a system data base by providing a plurality of starting values from each of said semiconductor devices into a system database, said starting values representing a plurality of device parameters;

(d) measuring a plurality of snap-shot values for each of said device parameters while said device is in said powered state;

(e) calculating a plurality of average values, ranges and operating limits for each of said device parameters;

(f) storing said snap-shot values, average values, ranges, and operating limits into a system data base;

(g) testing said average values and said ranges against said operating limits to produce a plurality of results;

(h) selecting an output dependent upon said results;

(i) if said output is not an alarm state, repeating steps (d) to (h) until said output is said alarm state.

10. The method of claim 9 wherein said device parameters includes a thermal resistance $R_{thJC}$.

11. The method of claim 10 wherein said device parameters further includes an on-resistance of a MOSFET $R_{DSON}$, power supply voltage $V_{DD}$, and a power supply current $I_{DD}$.

12. The method of claim 9 wherein said device parameters further includes a collector to emitter saturation voltage for an IGBT $V_{CESAT}$, power supply voltage $V_{DD}$, and a power supply current $I_{DD}$.

13. The method of claim 9 wherein said measuring step occurs at a turn-on, at just before a turn-off, and at a periodic time frequency between said turn-on and said turn-off.

14. The method of claim 9 wherein said periodic time frequency is about one hour and greater.

15. The method of claim 9 further comprising the step of turning said device off, turning said system off, and repairing or replacing said semiconductor device after said alarm state.

16. The method of claim 9 wherein each of said starting values are calculated from an initial snap-shot value and a manufacturer's specified value.

17. A method of identifying a reject semiconductor integrated circuit device comprising the steps of:

providing a semiconductor device, said semiconductor device being attached to an island by an interface material;

providing power to said semiconductor device, said power expanding causing thermal expansion of said island, said interface material, and said semiconductor device;

initializing a system data base by providing an initial value for a device parameter for said semiconductor device;

exercising said semiconductor device;

successively measuring a snap-shot value of said device parameter during said exercising step;

calculating a plurality of average values from said initial device parameter and said snap-shot value;

identifying differences between each of said average values; and rejecting said semiconductor device based upon said differences.

18. The method of claim 1 wherein said thermal expansion provides an increased resistance between said die island and said semiconductor device to increase.

19. The method of claim 1 wherein said thermal expansion provides a power supply current to increase.

20. The method of claim 1 wherein said performance is selected from a group consisting of an interface failure, a wire failure, and a semiconductor device failure.

* * * * *

UNITED STATES PATENT AND TRADEMARK OFFICE
CERTIFICATE OF CORRECTION

PATENT NO.   : 5,654,896
DATED        : August 5, 1997
INVENTOR(S)  : Sam Seiichiro Ochi It is certified that error appears in the above-identified patent and that said Letters Patent is hereby corrected as shown below:

Title page left hand column after [76] insert -- [73] Assignee IXYS Corporation, Santa Clara, California --.

After "Assistant Examiner – Tyrone V. Walker" insert on next line -- Attorney, Agent, or Firm – Townsend and Townsend and Crew LLP --.

Signed and Sealed this

Tenth Day of April, 2001

*Attest:*

NICHOLAS P. GODICI

*Attesting Officer*           *Acting Director of the United States Patent and Trademark Office*